United States Patent
Bernstein et al.

(10) Patent No.: US 6,221,169 B1
(45) Date of Patent: Apr. 24, 2001

(54) SYSTEM AND METHOD FOR CLEANING CONTAMINATED SURFACES IN AN ION IMPLANTER

(75) Inventors: James D. Bernstein, Beverly; Peter M. Kopalidis, Arlington; Brian S. Freer, Medford, all of MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/309,096

(22) Filed: May 10, 1999

(51) Int. Cl.[7] .................................. B08B 7/00; G21K 5/00

(52) U.S. Cl. .................................. 134/2; 134/1; 134/1.1; 134/36; 250/492.2

(58) Field of Search .................................. 134/1, 1.1, 1.2, 134/1.3, 2, 34, 36, 37; 250/492.3, 492.21, 492.2, 398, 399, 492.1; 438/905

(56) References Cited

U.S. PATENT DOCUMENTS

| | | | |
|---|---|---|---|
| 4,703,183 | * 10/1987 | Guerra | 250/492.2 |
| 5,144,147 | * 9/1992 | Shiozaki et al. | 250/492.2 |
| 5,554,854 | 9/1996 | Blake | 250/492.21 |
| 5,576,538 | * 11/1996 | Sakai et al. | 250/251 |
| 5,633,506 | * 5/1997 | Blake | 250/492 |
| 5,779,849 | 7/1998 | Blalock | 156/345 |
| 5,843,239 | 12/1998 | Shrotriya | 134/1.1 |
| 5,940,724 | * 8/1999 | Warren | 438/514 |

FOREIGN PATENT DOCUMENTS 2-155147 * 6/1990 (JP) .

OTHER PUBLICATIONS

Larson et al, Metallic Impurities and Dopant Cross–Contamination Effects in Ion Implanted Surfaces, MRSSP, vol. 45, pp. 381–388. 1985.*

* cited by examiner

Primary Examiner—Alexander Markoff
(74) Attorney, Agent, or Firm—John A. Kastelic

(57) ABSTRACT

A method and system is provided for cleaning a contaminated surface of a vacuum chamber, comprising means for (i) generating an ion beam (44) having a reactive species (e.g., fluorine) component; (ii) directing the ion beam toward a contaminated surface (100); (iii) neutralizing the ion beam (44) by introducing, into the chamber proximate the contaminated surface, a neutralizing gas (70) (e.g., xenon) such that the ion beam (44) collides with molecules of the neutralizing gas, and, as a result of charge exchange reactions between the ion beam and the neutralizing gas molecules, creates a beam of energetic reactive neutral atoms of the reactive species; (iv) cleaning the surface (100) by allowing the beam of energetic reactive neutral atoms of the reactive species to react with contaminants to create reaction products; and (v) removing from the chamber any volatile reaction products that result. Alternatively, the method and system include means for (i) generating an energetic non-reactive (e.g., xenon) ion beam (44); (ii) directing the non-reactive ion beam toward a contaminated surface (100); (iii) introducing a cleaning gas (70) proximate the contaminated surface, comprised at least partially of a reactive species (e.g., fluorine) component; (iv) dissociating the cleaning gas using the ion beam (44) to create a supply of energetic reactive neutral atoms of the reactive species; (v) cleaning the surface (100) by allowing the energetic reactive neutral atoms of the reactive species to react with contaminants to create reaction products; and (vi) removing from the chamber any volatile reaction products that result.

19 Claims, 3 Drawing Sheets

SYSTEM AND METHOD FOR CLEANING CONTAMINATED SURFACES IN AN ION IMPLANTER

RELATED APPLICATION

The following U.S. patent applications are incorporated by reference herein as if they had been fully set forth: application Ser. Nos. 09/309,466 and 09/309,094, entitled System and Method for Cleaning Silicon-Coated Surfaces in an Ion Implanter, and System and Method for Cleaning Contaminated Surfaces in an Ion Implanter, respectively, both filed on May 10, 1999.

FIELD OF THE INVENTION

The present invention relates generally to the field of ion implanters, and more specifically to an improved system and method for cleaning contaminated surfaces of an ion implanter.

BACKGROUND OF THE INVENTION

Ion implantation has become the technology preferred by industry to dope semiconductors with impurities in the large-scale manufacture of integrated circuits. Ion dose and ion energy are the two most important variables used to define an implant step. Ion dose relates to the concentration of implanted ions for a given semiconductor material. Typically, high current implanters (generally greater than 1 milliamp (mA) ion beam current) are used for high dose implants, while medium current implanters (generally capable of up to about 1 mA beam current) are used for lower dose applications.

Ion energy is the dominant parameter used to control junction depth in semiconductor devices. The energy levels of the ions which make up the ion beam determine the degree of depth of the implanted ions. High energy processes such as those used to form retrograde wells in semiconductor devices require implants of up to a few million electron volts (MeV), while shallow junctions may only demand ultra low energy (ULE) levels below one thousand electron volts (1 KeV).

A typical ion implanter comprises three sections or subsystems: (i) an ion source for outputting an ion beam, (ii) a beamline including a mass analysis magnet for mass resolving the ion beam, and (iii) a target chamber which contains the semiconductor wafer or other substrate to be implanted by the ion beam. Ion sources in ion implanters typically generate an ion beam by ionizing within a source chamber a source gas or vapor, a component of which is a desired dopant element, and extracting the ionized source gas in the form of an ion beam.

Internal parts of ion implanters located along the beamline and in the target chamber may become contaminated by the species being implanted during the course of continued operation. Components that are prone to contamination are those that the ion beam impacts during processing. Along the beamline, components which may become contaminated include the strike plate inside the mass analysis magnet, accelerating electrodes, resolving apertures, and plasma flood components. In the target chamber, at least in high current ion implanters, target wafers are positioned on the periphery of an aluminum disk. The disk is both rotated and translated past a stationary ion beam so that the beam implants ions into the entire surface of the wafer. As a result, portions of the disk not covered by a wafer become contaminated with the dopant species.

Because ion implanters are operated using a variety of process recipes, different types of source gases are run in the source to obtain ion beams comprising the desired species of dopant ions. If, however, the target disk (or other beamline component) becomes contaminated by implantation or sputtering of a species during a previous process recipe (e.g., one involving phosphorous), a later process recipe (e.g., one involving arsenic) may be adversely effected by this cross-contamination. For example, phosphorous which has been sputtered onto or implanted into the surface of an aluminum target disk or beamline component may be dislodged by a subsequent arsenic ion beam, resulting in process contamination.

It is known to generate an ion beam comprised of a reactive species, such as fluorine, between successive implant processes to clean internal portions of an ion implanter (see for example, U.S. Pat. No. 5,554,854 to Blake). However, Blake suggests the use of ionized fluorine to effect such cleaning, because the beam must be ionized (positively) to be transported through the implanter. The Blake system does not suggest the use of an atomic neutral reactive species for cleaning the internal components of an ion implanter.

Accordingly, it is an object of the present invention to provide a system and method for cleaning surfaces to remove contaminants therefrom. It is a further object to provide a system and method for cleaning the internal components of an ion implanter using the ion beam to generate reactive neutral atomic radicals of a cleaning gas. It is still a further object of the present invention to provide such a system and method for use in cleaning either silicon-coated or uncoated internal implanter components.

SUMMARY OF THE INVENTION

A method and system is provided for cleaning a contaminant from a surface of a vacuum chamber. The method and system include means for (i) generating an ion beam having a reactive species (e.g., fluorine) component; (ii) directing the ion beam toward a surface to be cleaned; (iii) neutralizing the ion beam by introducing, into the chamber proximate the surface to be cleaned, a neutralizing gas (e.g., xenon) such that the ion beam collides with molecules of the neutralizing gas, and, as a result of charge exchange reactions between the ion beam and the neutralizing gas molecules, creates a beam of energetic reactive neutral atoms of the reactive species; (iv) cleaning the surface by allowing the beam of energetic reactive neutral atoms of the reactive species to react with contaminants to create reaction products; and (v) removing from the chamber any volatile reaction products that result from the cleaning process. The neutralizing gas may contain a second reactive species component, such that the neutralizing gas molecules are dissociated into reactive atomic neutral atoms upon colliding with the ion beam.

Alternatively, the method and system include means for (i) generating an energetic non-reactive (e.g., xenon) ion beam; (ii) directing the non-reactive ion beam toward a surface to be cleaned; (iii) introducing a cleaning gas proximate the surface to be cleaned, comprised at least partially of a reactive species (e.g., fluorine) component; (iv) dissociating the cleaning gas using the ion beam to create a supply of energetic reactive neutral atoms of the reactive species; (v) cleaning the surface by allowing the energetic reactive neutral atoms of the reactive species to react with contaminants to create reaction products; and (vi) removing from the chamber any volatile reaction products that result from the cleaning process. The cleaning gas may be characterized by a high sticking coefficient and is allowed to collect onto and adsorb into the surface to be cleaned prior to being dissociated by the ion beam.

DETAILED DESCRIPTION OF A PREFERRED EMBODIMENT

Figure 1:
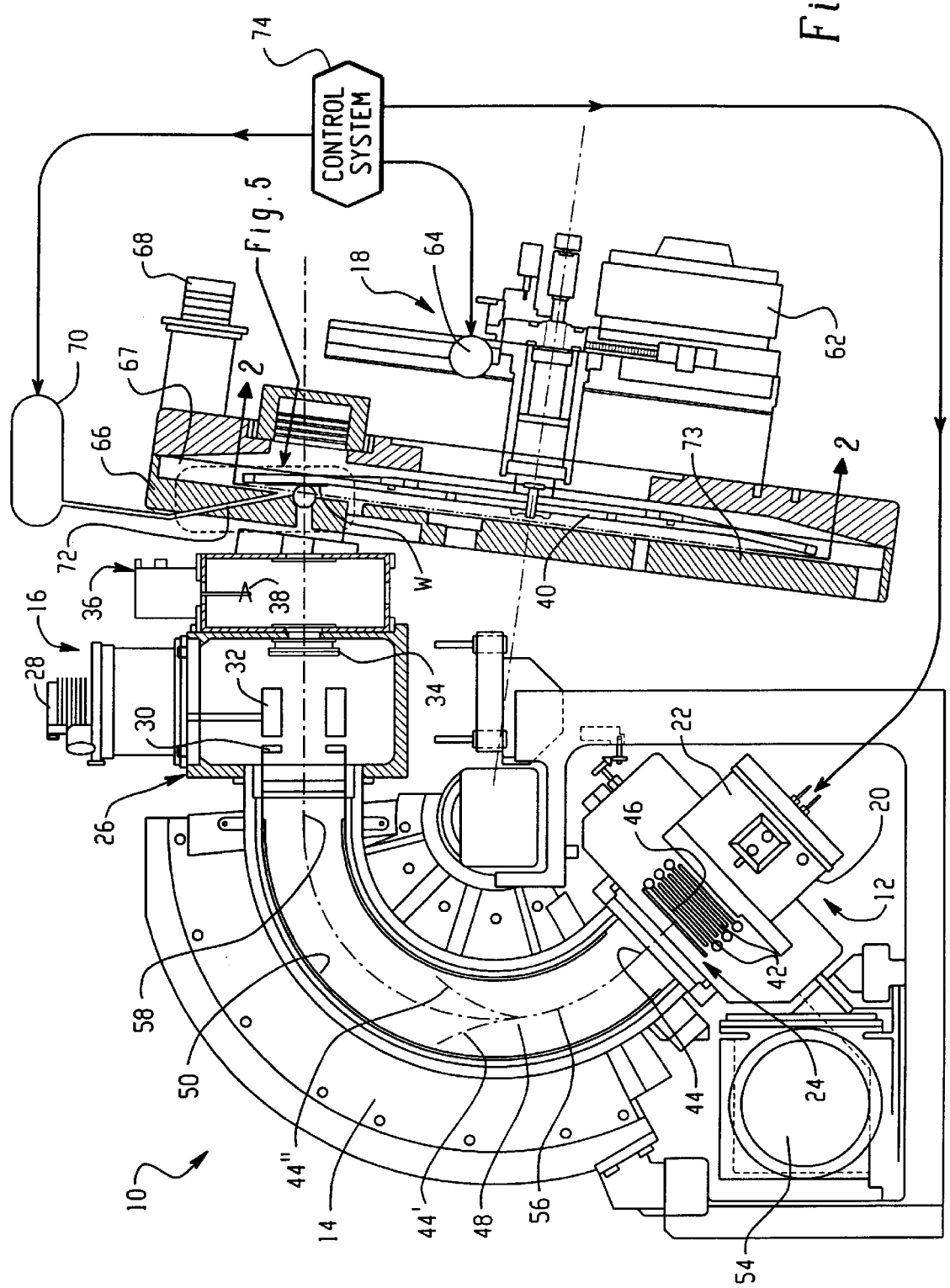
FIG. 1 is a cross sectional plan view of an ion implantation system into which is incorporated one embodiment of a cleaning device constructed according to the principles of the present invention.

Referring now to the drawings, FIG. 1 discloses an ion implanter, generally designated 10, which comprises an ion source 12, a mass analysis magnet 14, a beamline assembly 16, and a target or end station 18. One application of the present invention is in a low energy implanter, such as that shown in FIG. 1, wherein the beamline assembly 16 is relatively short due to the tendency of a low energy beam to expand (i.e., "blow-up") during propagation thereof.

The ion source 12 comprises a housing 20 that defines a plasma chamber 22, and an ion extractor assembly 24. The beamline assembly 16 includes (i) a resolving housing 26 which is evacuated by vacuum pump 28 and which contains a terminal aperture 30, a resolving aperture 32, a flag Faraday 34, and any post acceleration or other electrodes which may be present therein; and (ii) a beam neutralizer 36 which contains a plasma flood 38, none of which form a part of the present invention. Downstream of the beam neutralizer 36 is the end station 18, which includes a disk-shaped wafer support disk 40 upon which wafers W to be treated are mounted. As used herein, wafer shall include any type of substrate, which may be implanted with an ion beam.

Energy is imparted to the ionizable dopant gas or vapor to generate ions within the plasma chamber 22. Generally, positive ions are generated, although the present invention is applicable to systems wherein negative ions are generated by the source. The positive ions are extracted through a slit in the plasma chamber 22 by the ion extractor assembly 24 which comprises a plurality of electrodes 42. Accordingly, the ion extractor assembly functions to extract a beam 44 of positive ions from the plasma chamber through an extraction aperture plate 46 and accelerate the extracted ions toward the mass analysis magnet 14.

The mass analysis magnet 14 functions to pass only ions of an appropriate charge-to-mass ratio to the beamline assembly 16. The mass analysis magnet 14 includes a curved beam path 48 which is defined by a beam guide or strike plate 50 connected to the source 12, evacuation of which is provided by vacuum pumps 28 and 54. The ion beam 44 that propagates along this path is affected by the magnetic field generated by the mass analysis magnet 14.

The magnetic field causes the ion beam 44 to move along the curved beam path 48, from a first or entrance trajectory 56 near the ion source 12 to a second or exit trajectory 58 near the resolving housing 26. Portions 44' and 44" of the beam 44 comprised of ions having an inappropriate charge-to-mass ratio are deflected away from the curved trajectory and into the walls of aluminum beam guide or strike plate 50. In this manner, the magnet 14 passes to the beamline assembly 16 only those ions in the beam 44 that have the desired charge-to-mass ratio.

The wafer support disk 40 at the end station 18 is rotated by motor 62. The disk shaped support disk 40, having wafers W mounted thereon, is rotated at a constant angular velocity by a motor 62, and support disk 40 is moved vertically (into and out of the page of FIG. 1) by a motor 64 and a lead screw (not shown). As such, the entire surface of a wafer may be implanted by a stationary beam which at any given time covers only a small portion of the wafer. The disk 40 and the wafers positioned thereon are contained within a process chamber housing 66 the interior chamber 67 of which is evacuated by a roughing pump 68.

The present invention may be used to clean internal surfaces of components of the implanter 10 such as the strike plate 50, the apertures 30, 32 or other electrodes contained within the resolving housing 26, components of the plasma flood 38 that come into contact with the ion beam during normal operation, or the wafer support disk 40. The invention is implemented by either (i) generating an ion beam with a reactive species, such as fluorine, and neutralizing the beam with an inert species, such as xenon, proximate the area where the beam strikes the surface to be cleaned, or (ii) introducing a parent cleaning gas, such as $NF_3$, proximate the area where the beam strikes the surface to be cleaned, and dissociating the parent gas using an ion beam generated from an inert species, such as xenon. Using either method, reactive neutral atomic radicals, such as fluorine, are generated for cleaning surfaces of desired implanter components.

Figure 2:
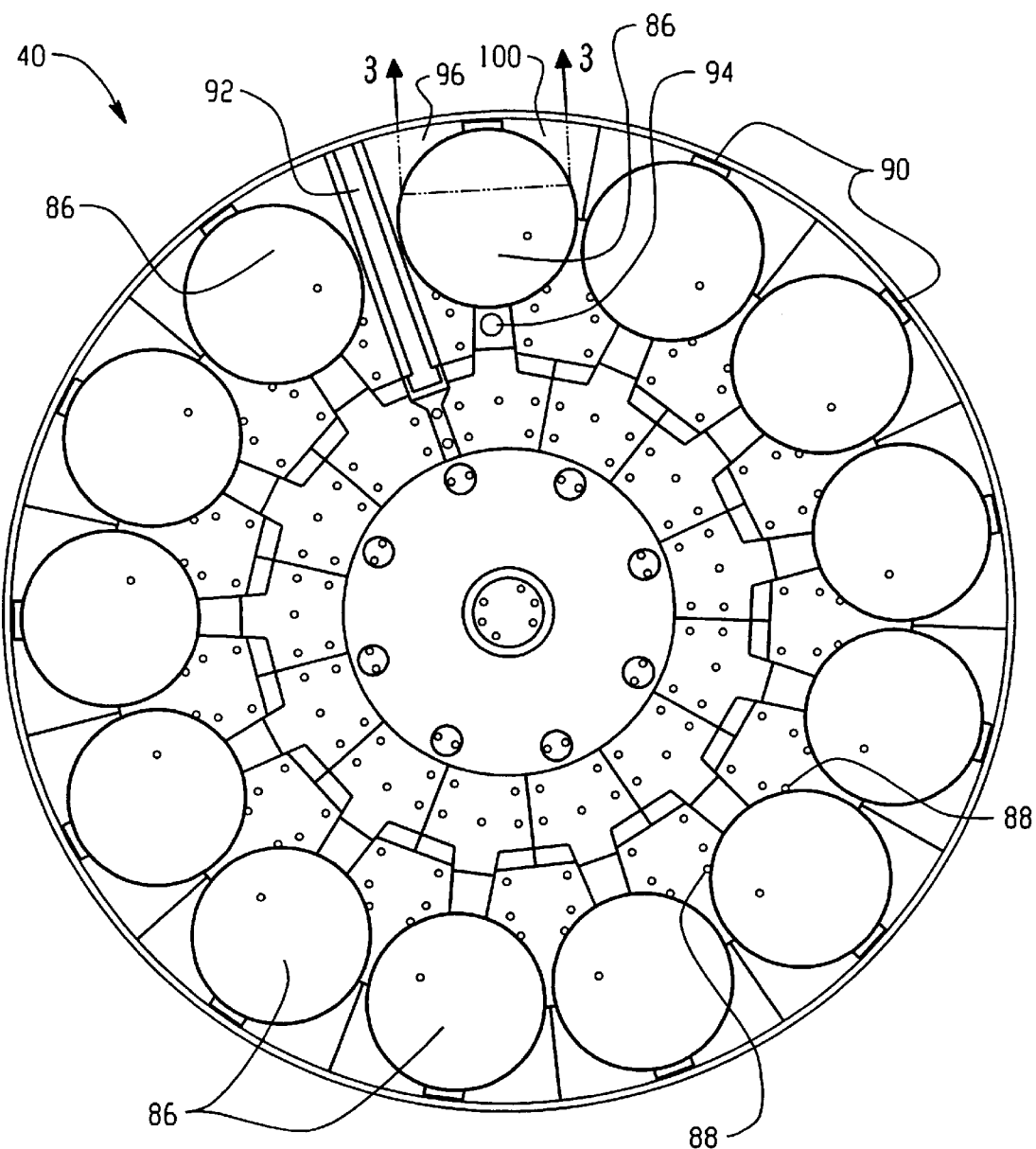
FIG. 2 is a plan view of the wafer support disk of the ion implanter of FIG. 1 taken along the lines 2—2.
Figure 3:
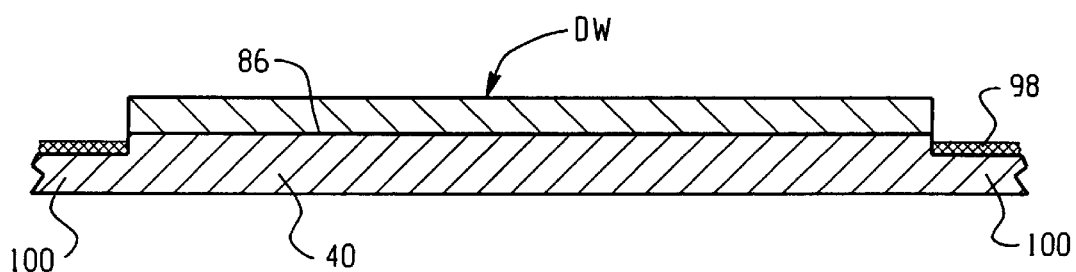
FIG. 3 is a cross sectional view of a silicon-coated version of the support disk of FIG. 2, taken along the lines 3—3.

Although the invention may be implemented at various locations in the implanter 10, as further explained below, implementation at the wafer support disk 40 is set forth in the drawings and fully described herein. The wafer support disk 40 (see FIGS. 2 through 4) is made of either aluminum, or silicon-coated aluminum which reduces the amount of aluminum surface contamination during implantation processes. The present invention is embodied in the form of a gas supply 70 that interacts with an ion beam to either (i) clean the aluminum surface of an uncoated disk (FIG. 4) or (ii) controllably strip a finite layer of silicon from a silicon coated disk to remove any contaminants that may be implanted into the layer (FIGS. 2 and 3). As used herein, the terms "erode", "clean", "etch", "remove" and "strip" all refer to selective removal of contaminants from a surface such as the wafer support disk 40.

The gas supply 70 stores a gas that contains a reactive component, such as fluorine, or an inert gas such as xenon or argon, depending upon the mechanism chosen to clean the disk 40. The gas is supplied to the interior 67 of the process chamber housing 66. One example of a gas entry means is provided by a long thin gas inlet tube 72 having a high aspect (length-to-diameter) ratio. Gas flow from the supply 70 to the tube 72 is monitored and determined by control system 74.

Figure 5:
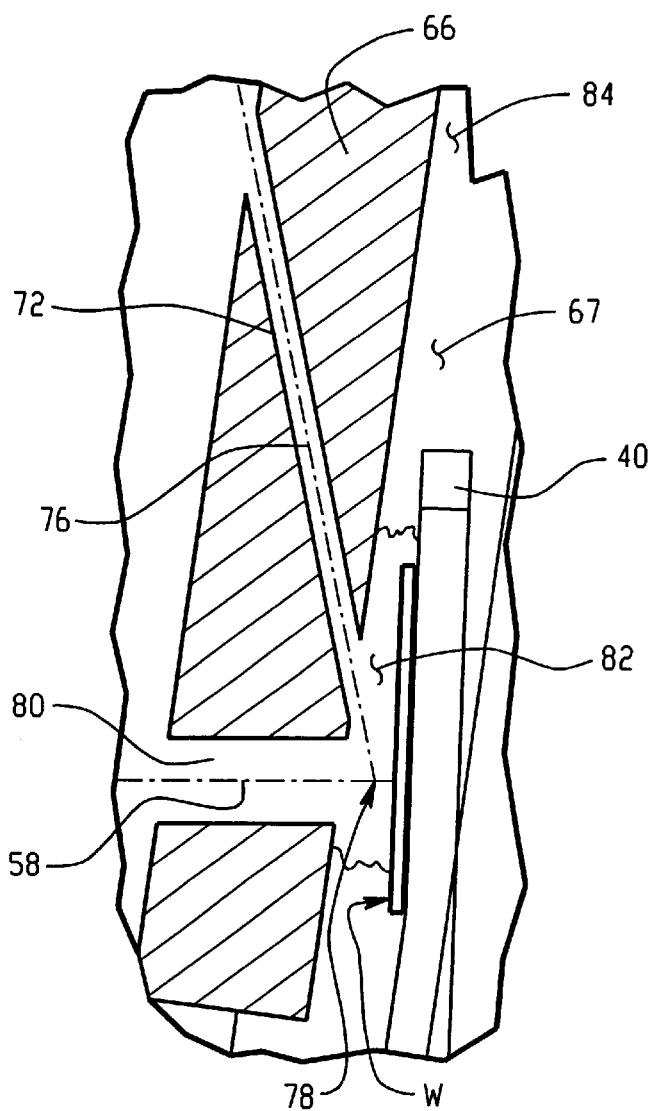
FIG. 5 is an expanded detailed view of a portion of the ion implantation system of FIG. 1.

Gas flows into the chamber through the tube 72, having a longitudinal axis 76 (see FIG. 5), which passes through the process chamber housing 66. The tube axis 76 intersects at point 78 with the trajectory 58 of the ion beam that passes through an entry 80 in the process chamber housing. By introducing the gas from supply 70 near the location of the implanter component to be cleaned, gas flow rates may be minimized while still achieving a localized area 82 of high pressure (and gas concentration) within a surrounding area 84 of lower pressure inside the evacuated process chamber 67. The divergence of the gas flow from the tube 72 lessens as the aspect ratio of the tube increases. As a result, a high gaseous concentration in localized area 82 produces more reactive radicals from collisions with the ion beam.

The cleaning mechanism provided by the present invention involves the creation of a high concentration of reactive atomic species of a cleaning gas, such as fluorine, using either of two mechanisms. First, the reactive atomic species may be created by using a fluorine ion beam generated at the source 12 from a source gas such as $NF_3$, $BF_3$, $XeF_2$, $CF_4$, $SiF_4$, or $C_2F_6$, and directed through process chamber entry 80. The ionized beam is neutralized by injecting an inert neutralizing gas such as xenon through the inlet tube 72. Xenon is preferred because it is inoffensive to semiconductor devices residing on the wafer, and because it has a large charge-exchange cross-section that enhances the potential for collision with the ion beam. A beam of energetic, reactive neutral fluorine atoms is thereby created by charge-exchange reactions between the neutralizing gas molecules and the energetic ion beam.

As a subset of this first cleaning mechanism, the neutralizing gas may be chosen from one of the source gases listed above. Using a gas which includes a reactive component (e.g., fluorine) as the neutralizing gas provides additional benefits in that the neutralizing gas itself becomes reactive as a result of molecular dissociation effected by collision with the ion beam.

Alternatively, an energetic non-reactive ion beam (e.g., xenon) may be generated at the source 12 and directed through process chamber entry 80. The ion beam is used to impact and thereby dissociate a cleaning gas including a reactive component, such as $NF_3$, which is introduced through the inlet tube 72. Collisional byproducts resulting from the impact of the beam with the gas create a supply of energetic, reactive neutral fluorine atoms.

As a subset of this alternative cleaning mechanism, a cleaning gas with a high sticking coefficient may be introduced through the inlet tube 72, and allowed to collect onto and adsorb into the surface of the disc 40. The energetic non-reactive ion beam may be used to break down the chemical bonds of the adsorbed molecules, thereby dissociating the gas molecules adhering to the surface to create reactive neutral atoms. An example of such dissociation is the breakdown of inert, non-reactive $CF_4$ molecules into $CF_3$, $CF_2$, $CF$, and $F$ radicals. (The fluorine may also be provided in the form of $NF_3$, $BF_3$, $XeF_2$, $SiF_4$, or $C_2F_6$ gas.)

These reactive radicals will subsequently react with contaminants to form volatile byproducts that will desorb from the surface and be removed by pumping. Both the surface chemical reaction and the byproduct desorption are accelerated by the energy provided by the ion beam. In the case of phosphorous contaminant removal, the reaction byproducts will be volatile phosphorous fluorides which can be easily pumped away.

The cleaning mechanism provided by the present invention may be used to clean uncoated (e.g., aluminum) internal implanter components, or coated (e.g., silicon-coated) internal implanter components. Also, the ion beam may be either stationary or rastered, depending upon the internal component to be cleaned. In addition, the gas from supply 70 may be introduced at various locations along the implanter 10, depending upon the internal component to be cleaned. Although the cleaning gas used in both of the mechanisms described above is fluorine, other cleaning gases are contemplated (e.g., chlorine).

The cleaning mechanism of the present invention will now be explained in detail with reference to cleaning of a silicon-coated support disk 40, using a stationary ion beam, although the cleaning mechanism is applicable to other implanter components. The mechanism described is the second mechanism mentioned above, that is, using an energetic non-reactive ion beam (e.g., xenon) generated at the source 12 and directed through process chamber entry 80, and using the ion beam to dissociate a cleaning gas including a reactive component, such as $NF_3$, which is introduced through the inlet tube 72.

As shown in FIG. 2, the support disk 40 is a generally circular element comprised of aluminum having, in this case, thirteen slightly raised disk pedestals 86 in which a wafer W may be held. As shown in FIG. 2, no wafers W are positioned on the support disk. Clamping pins 88 and a stop 90 positively positions the wafer upon the disk. A disk current slot 92 permits a portion of the ion beam passing through the disk to be analyzed, and charge sensors 94 provide information regarding wafer charging.

As shown in FIG. 3, the wafer support disk 40 is coated with a layer 98 of silicon. The silicon covers the entire disk 40, except for the pedestals 86 upon which the wafers are positioned and the portions 100 of the disk between and around adjacent pedestals. The silicon layer 98 is applied by a plasma enhanced chemical vapor deposition (PECVD) process. Surmet Corporation of Burlington, Mass. is in the business of providing such PECVD silicon coatings. As opposed to a plasma or flame spray application of silicon, which provides a highly granular surface having unpredictable etching characteristics, a PECVD application of silicon provides a homogenous, uniform surface grain structure that exhibits predictable etching rates. Preferably, the grain size is sufficiently small and of sufficiently high density to provide surface finish of Ra=0.2–0.4 micron ($\mu$m) in order to insure predictable uniformity and repeatability of silicon removal.

The silicon coating is applied so that a layer having a depth of about 25 microns is deposited on the surface of the disk 40. Such a depth is considerably more than would otherwise be deposited on the disk 40, in the anticipation that a selected depth of the layer will be uniformly removed (etched) at regular operating intervals using the cleaning system and process of the present invention.

During implantation, both the wafers W installed on the pedestals 86, and the portions 100 of the disk between and around adjacent pedestals, are implanted with dopant ions. The implanted ions within the portions 100 of the disk 40, outside of the wafer locations, may present contamination problems in subsequent implants.

It has been found that implanted ions (e.g., boron or phosphorous) are implanted into portions 100 of the disk at depths of up to about 1000 Angstroms (Å), or 0.1 micron ($\mu$m). However, it has also been found that by removing a layer of silicon of only about 500 Å (0.05 $\mu$m), a significant majority of the implanted species is removed from the disk 40. Because the silicon layer 98 has an original thickness of about 25 microns (generally within the range of 18–35 microns), theoretically the disk 40 may be stripped/etched up to 500 times before the entire silicon layer 98 has been etched away.

The preferred gas used in supply 70 is, for example, a commercially available gas such as $NF_3$, $BF_4$, $CF_4$, or $C_2F_6$. The use of $SF_6$ is also possible, though less desirable due to the increased likelihood of sulfur contamination. $F_2$ is yet another possible fluorine source, although in such a form, presents minor handling difficulties.

In a preferred embodiment, the fluorine-containing gas is a non-reactive gas stored in supply 70 and introduced into the process chamber 67. An energetic non-reactive ion beam (e.g., xenon or argon) impacts the fluorine-containing gas to create either a plasma or other supply of dissociated reactive atomic fluorine radicals. Once the fluorine-containing gas is dissociated into reactive atomic fluorine radicals, the reactive atomic fluorine radicals in the plasma react with and consume a portion of the silicon layer 98.

Dummy wafers DW are installed on the pedestals 86 so that the wafer-supporting portions of the disk 40, which have not been contaminated, are not cleaned. Thus, only portions 100 of the disk between and around the pedestals 86 are subject to the silicon stripping process. While the non-reactive ion beam remains stationary, the disk 40 is rotated and translated vertically so that the entirety of portions 100 is exposed to the reactive atomic species in the plasma to effectuate silicon stripping.

The mechanism for the controlled removal of silicon is believed to be a three step process: (i) adsorption of the reactive atomic fluorine radicals into the silicon surface; (ii) surface reaction of the silicon with the reactive atomic fluorine radicals to form volatile reaction products such as silicon fluorides; and (iii) desorption of these reaction products into the gas phase. In addition, because the reaction products are volatile and in a gaseous phase, they are continuously removed from the process chamber 67 by the evacuation pump 68.

In the case of a non-coated aluminum disk (FIG. 4), a contaminant 99 such as phosphorous (P) has been sputtered onto the disk as a result of a prior implant process utilizing a phosphorous ion beam. Reactive atomic fluorine radicals react with the phosphorous to create reaction products (i.e., phosphorous fluorides). These volatile reactive products are continuously removed from the process chamber 67 by the evacuation pump 68.

In addition, at the surface of the uncoated aluminum disk, the reactive atomic fluorine radicals react with the aluminum to create a stable, inert layer of an aluminum fluoride compound that will remain on the surface of the disk. Once such a layer is created, the atomic fluorine will no longer react with the aluminum surface therebelow. This inert layer, being non-volatile, is not pumped out of the process chamber. Below the surface of the aluminum disk, no reaction of atomic fluorine occurs.

Figure 4:
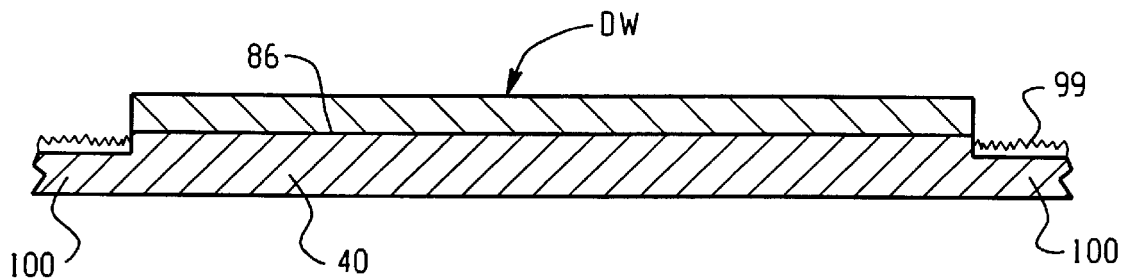
FIG. 4 is a cross sectional view of an uncoated version of the support disk of FIG. 2, taken along the lines 3—3.

Free non-ionized fluorine atoms are found to be the most reactive with the portions 100 of silicon layer 98 that are stripped (FIG. 3), or with the phosphorous contaminant 99 to be removed from the disk (FIG. 4). $F_2$, and F+ and F− ions are found to be less reactive. The method and rate at which the reactive fluorine atoms etch the silicon layer or react with the phosphorous contaminant may be carefully controlled by monitoring and controlling several operating parameters. First, the gas flow rate from the tank 70 to the process chamber 67 may be controlled to determine the amount of gas available to be dissociated into reactive fluorine radicals. The gas flow rate will generally determine the pressure in the process chamber 67, because the speed of the evacuation pump 68 and the volume of the process chamber 67 remain fixed.

Other factors determine the method and rate of cleaning/ etching. For example, the gas introduced into chamber 67 may be diluted with an inert gas such as argon or nitrogen to reduce the amount of fluorine available for dissociation. The pressure at which the gas is introduced into the chamber also in part determines the rate of dissociation. Next, the ion beam current, energy and species composition may be controlled to determine the rate of dissociation. In addition, the duration of time during which the silicon layer 98 or the contaminant 99 is exposed to the reactive fluorine atoms may be controlled. In connection with this exposure time, the rotation and translation speed of the disk 40 may be controllably varied. A comprehensive control system 102 or separate control systems may be utilized to monitor and control some or all of these parameters to precisely control the etch rate of the silicon layer 98 or the removal of contaminant 99.

An optical emission spectroscopy (OES) system may be used to monitor the constituency of the gases present at the surface of the disk within the process chamber housing 66. For example, if phosphorous contamination is present in the silicon layer 98 of a coated disk (FIG. 3), or on the surface of an uncoated disk (FIG. 4), the reaction products created will be in the family of phosphorous fluorides (e.g., PF, $PF_2$, or $PF_3$). At some point in the monitoring process, the amount of phosphorous fluorides will drop off, indicating that the majority of phosphorous contamination has been removed either from the silicon layer 98 or from the surface of the disk. In this manner, the cleaning process may be optimized so that the process may be ended when the level of phosphorous fluorides falls below a prescribed level.

The invention has been described in detail above as an embodiment wherein an energetic non-reactive ion beam (e.g., xenon) collides with an inert gas containing a reactive component (e.g., fluorine) to create reactive atomic fluorine radicals. The present invention also contemplates the use of an energetic, reactive ion beam (e.g., fluorine) collides with an inert gas (e.g., xenon) or an inert gas containing a reactive component to create the same reactive atomic fluorine radicals.

In addition, the invention has been described in detail above as an embodiment wherein an implanter component (the disk 40) moves with respect to a stationary ion beam. The present invention also contemplates the use of a rastered ion beam to clean a stationary implanter component. In such a system, the control system 74 output to the motor 64 would instead be output to an ion beam raster control mechanism.

For example, a beam rastering system such as that shown in U.S. Pat. No. 5,554,854 may be utilized to vary the magnetic field, and hence the beam deflectability, of the mass analysis magnet 14. The gas supply inlet 72 may be positioned near the magnet entrance, exit, or within the cavity. Neutral reactive atoms created by collisions with the gas introduced at inlet 72 will, unlike ions, not experience a curved trajectory. Instead, these reactive neutrals will strike the surface to be cleaned that is located in the direction that the ion was travelling just prior to the neutralizing event. A wide variable area of the strike plate may be cleaned by varying the pressure within the magnet cavity. The number of reactive neutral atoms striking a particular surface of the strike plate may be controlled by changing the pressure within different areas of the magnet cavity.

For areas downstream of the mass analysis magnet, apertures 30 and/or 32 may be made variable in size so that the rastered beam may clean a larger surface area. In this manner, a widened aperture is made available for cleaning, for example, plasma flood components. During normal operation of the implanter, the variably sized aperture may be reset to a more restrictive position to enhance ion beam mass resolution.

In a system that included such an ion beam rastering mechanism, the gas supply 70 may be located proximate the component to be cleaned. The cleaning mechanisms described in detail above would remain the same. For example, as explained above, to clean the strike plate 50 within the mass analysis magnet 14, the beam may be rastered across the strike plate and the gas supply may be provided with an inlet near the surface to be cleaned. Similarly, if apertures or electrodes within the resolving housing 26 are to be cleaned, the beam may be rastered across such apertures/electrodes and the gas supply may be provided with an inlet nearby.

Accordingly, a preferred embodiment of a method and system for selective and controlled cleaning of a contaminated ion implanter component has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What we claim is:

1. A process of cleaning a contaminant from a surface of a vacuum chamber, comprising
   (i) generating an ion beam (44) having a fluorine component;
   (ii) directing the ion beam toward a surface (100) to be cleaned;
   (iii) neutralizing the ion beam (44) by introducing, into the chamber proximate the surface to be cleaned, a neutralizing gas (70) such that the ion beam (44) collides with molecules of the neutralizing gas, and, as a result of charge exchange reactions between the ion beam and the neutralizing gas molecules, creates a beam of neutral fluorine atoms;
   (iv) cleaning the surface (100) by allowing the beam of neutral fluorine atoms to react with contaminants to create reaction products; and
   (v) removing from the chamber any volatile reaction products that result from the cleaning process.

2. The process of claim 1, wherein the neutralizing gas (70) is inert.

3. The process of claim 2, wherein the inert neutralizing gas (70) is xenon.

4. The process of claim 1, wherein the neutralizing gas (70) contains a second fluorine component, such that the neutralizing gas molecules are dissociated into atomic neutral atoms upon colliding with the ion beam (44).

5. The process of claim 1, wherein the vacuum chamber is an ion implantation process chamber (67) and the surface (100) to be cleaned is a wafer supporting disk (40).

6. The process of claim 1, wherein the surface (100) to be cleaned is aluminum.

7. The process of claim 6, wherein the aluminum surface to be cleaned is silicon-coated.

8. The process of claim 1, wherein the contaminant is phosphorous.

9. The process of claim 1, wherein the ion beam (44) is rastered across the surface (100) to be cleaned.

10. A system for cleaning a contaminant from a surface of a vacuum chamber, comprising:
    (i) an ion source (12) for generating an ion beam (44) having a fluorine component;
    (ii) an extractor assembly (24) for extracting the ion beam from the source and directing the ion beam toward a surface (100) to be cleaned;
    (iii) a gas supply tube (72) for introducing a neutralizing gas into the chamber proximate the surface to be cleaned, for neutralizing the ion beam (44) by collisions between the ion beam and molecules of the neutralizing gas, such that, as a result of charge exchange reactions between the ion beam and the neutralizing gas molecules, a beam of neutral fluorine atoms is created and reacts with contaminants on the surface to create reaction products; and
    (iv) means (68) for removing from the chamber any volatile reaction products that result from the reaction process.

11. The system of claim 10, wherein the neutralizing gas (70) is inert.

12. The system of claim 11, wherein the inert neutralizing gas (70) is xenon.

13. The system of claim 10, wherein the neutralizing gas (70) contains a second fluorine component, such that the neutralizing gas molecules are dissociated into atomic neutral atoms upon colliding with the ion beam (44).

14. The system of claim 10, wherein the vacuum chamber is an ion implantation process chamber (67) and the surface (100) to be cleaned is a wafer supporting disk (40).

15. The system of claim 10, wherein the surface (100) to be cleaned is aluminum.

16. The system of claim 15, wherein the aluminum surface to be cleaned is silicon-coated.

17. The system of claim 10, wherein the contaminant is phosphorous.

18. The system of claim 10, further comprising a raster control mechanism for rastering the ion beam across the surface (100) to be cleaned.

19. The system of claim 10, wherein said gas supply tube (72) has a high aspect (length-to-diameter) ratio.

* * * * *